(12) United States Patent
Ewer et al.

(10) Patent No.: US 6,204,554 B1
(45) Date of Patent: *Mar. 20, 2001

(54) SURFACE MOUNT SEMICONDUCTOR PACKAGE

(75) Inventors: Peter R. Ewer; Arthur Woodworth, both of Surrey (GB)

(73) Assignee: International Rectifier Corporation, El Segundo, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/892,750

(22) Filed: Jul. 15, 1997

Related U.S. Application Data

(60) Provisional application No. 60/025,832, filed on Sep. 5, 1996.

(51) Int. Cl.⁷ ............................. H01L 23/28; H01L 23/36
(52) U.S. Cl. ..................... 257/705; 257/712; 257/678; 257/796; 257/675; 257/708; 257/709
(58) Field of Search ..................... 257/666, 675, 257/693, 692, 676, 678, 690, 696, 686, 705–709, 712, 713, 717, 720, 723, 730, 796

(56) References Cited

U.S. PATENT DOCUMENTS

| | | | |
|---|---|---|---|
| 3,786,317 | * | 1/1974 | Thierfelder .................. 317/234 R |
| 4,493,145 | * | 1/1985 | Honda ............................ 29/840 |
| 4,585,291 | * | 4/1986 | Noschese ..................... 339/117 R |
| 4,649,637 | * | 3/1987 | Hatakeyama ................. 257/675 |
| 5,047,837 | * | 9/1991 | Kitano et al. ................. 257/666 |
| 5,191,403 | * | 3/1993 | Nakazawa ..................... 257/787 |
| 5,317,194 | * | 5/1994 | Sako ............................ 257/796 |
| 5,408,128 | * | 4/1995 | Furnival ....................... 257/690 |
| 5,434,750 | * | 7/1995 | Rostoker et al. ............. 257/707 |
| 5,451,812 | * | 9/1995 | Gomi ........................... 257/666 |
| 5,483,098 | * | 1/1996 | Joiner, Jr. ..................... 257/676 |
| 5,521,429 | * | 5/1996 | Aono et al. ................... 257/676 |
| 5,557,150 | * | 9/1996 | Variot et al. .................. 257/787 |
| 5,594,234 | * | 1/1997 | Carter, Jr. et al. ............ 257/676 |
| 5,619,065 | * | 4/1997 | Kim .............................. 257/673 |
| 5,625,226 | * | 4/1997 | Kinzer .......................... 257/705 |
| 5,905,304 | * | 5/1999 | Ewer et al. ................... 257/705 |
| 5,977,630 | * | 11/1999 | Woodworth et al. ......... 257/712 |

FOREIGN PATENT DOCUMENTS

WO 93/19488 * 9/1993 (WO) .

* cited by examiner

*Primary Examiner*—Alexander Oscar Williams
(74) *Attorney, Agent, or Firm*—Ostrolenk, Faber, Gerb & Soffen, LLP

(57) ABSTRACT

A surface mount semiconductor package includes washing grooves disposed on a bottom surface of a plastic housing. The package also employs locking elements for locking the plastic housing to a metal pad on which a semiconductor device is mounted, where the locking elements include a cross bar between terminals, slots disposed on the metal pad which include barbs and dove-tail grooves disposed on the metal pad. The metal pad includes a waffled surface for improved coupling to a substrate. The package includes terminals having offset portions for providing spaces for the plastic housing material to fill for improved encapsulation of the terminals. The metal pad extends beyond the lateral edges of the plastic housing for improved heat dissipation and for providing a surface to couple to a heatsink.

62 Claims, 8 Drawing Sheets

SURFACE MOUNT SEMICONDUCTOR PACKAGE

CROSS REFERENCE TO RELATED APPLICATIONS

This application is based on and claims priority to Provisional Patent Application Ser. No. 60/025,832, filed Sep. 5, 1996, entitled IMPROVED SURFACE-MOUNT HIGH POWER SEMICONDUCTOR PACKAGE AND METHOD OF MANUFACTURE.

FIELD OF THE INVENTION

The present invention relates to semiconductor device packages and lead frames therefor, and more specifically relates to a high power semiconductor device adapted for surface mounting.

BACKGROUND OF THE INVENTION

Packages for high power semiconductor devices which can be surface mounted on an insulated metal substrate (IMS) or other flat support board surface are well known. One such package is shown in U.S. patent application Ser. No. 08/583,219, filed on Jan. 4, 1996, entitled SURFACE-MOUNT SEMICONDUCTOR PACKAGE which is incorporated herein by reference. Such packages are very well adapted for surface mounting to the conductive patterns of flat support boards such as an IMS structure (a thick copper or aluminum substrate covered by a thin insulation film which has a thin patternable copper or other conductive solderable upper surface).

The present invention is an improvement of the device of U.S. patent application Ser. No. 08/583,219, making it more efficient and more easily manufacturable.

SUMMARY OF THE INVENTION

In accordance with the invention, there is provided a novel lead frame which can receive one or more semiconductor die, such as power MOSFET die, IGBT die, fast recovery diode die, Schottky diode die, and mixtures thereof, on a central, flat pad section. The die are interconnected by the pad at their bottom surfaces, and at their tops by appropriate wire bonds. The lead frame has two power terminals, which may be interconnected at two adjacent corners of a rectangular package. The power terminals are accessible for connection externally of a flat plastic molded housing which encloses the top and sides of the central lead frame pad. A plurality of control pins or terminals, which initially are a part of the lead frame but are isolated from the heat sink pad after molding of the housing, extend from the side of the housing which is opposite the side containing the power terminal.

There are at least two closely spaced control terminals or pins which can be wire bonded to the gate and cathode or current sense terminals of the die within the housing. A remote third terminal (from the closely spaced first and second control terminals) is also available for connection to some other terminal, for example, the gate terminal of a thyristor die if such a die is contained within the housing.

The lead frame is preferably a single gauge conductive sheet. The terminals extending through the borders of the molded housing can be partially vertically offset to provide an improved plastic lock to the lead frame. The bottom surfaces of the terminals and the lead frame pad lie on a common plane. The main heat sink pad can have parallel slots therethrough on opposite sides of the die on the pad to provide a further plastic lock to the molded housing. Shallow dovetail grooves can extend from an interior edge of these slots toward one or both ends of the pad to also provide improved plastic locking.

The surface of the pad may have a waffled or dimpled surface to improve soldering of the bottom die surface electrodes to the pad. In accordance with a feature of the invention, the bottom surface of the pad which is to be surface mounted to a heat sink or conductive pattern of an IMS board can also be waffled to improve the ability to solder the pad to the heat sink and to avoid the formation of solder voids.

The bottom of the insulation housing is also provided with washing grooves which extend fully across the width of the package, are parallel to the sides containing input and output terminals and are located between the terminals and the pad. These grooves increase the surface tracking distance between the terminals and the pad and allow the washing out of solder flux during the solder down process.

In accordance with a further feature of the invention, short shallow shelves extend from the bottom ends of the grooves and across the width of the housing bottom to improve the flux washing function.

As previously described, the various terminal pins are partly vertically sheared or offset to improve the plastic lock. In accordance with a further feature of the invention, the partially rounded edge of the offset region is provided with a small square notch or stepped corner to give a sharp edge to prevent the bleeding of plastic over the bottom surfaces of the terminal during molding.

As a further feature of the invention, the terminals are formed with elongated crushable beads at their side surfaces adjacent the portions of the terminals just outside the plastic housing. These beads are crushed inwardly by a molding tool when it closes, to provide a seal which prevents the molding plastic to bleed out and over the sides of the terminals which extend beyond the housing and which could interfere with the solder connections to the terminals.

As a still further feature of the invention, an integral lead frame bar connects the power input terminals at the two corners of the housing and internally of the housing. Wire bonds from the die within the housing are made to this single bar which is contained within the housing. The bar improves the wire bond connection and also acts as a plastic lock to the housing.

Other features and advantages of the present invention will become apparent from the following description of the invention which refers to the accompanying drawings.

DETAILED DESCRIPTION OF THE DRAWINGS

Figure 2:
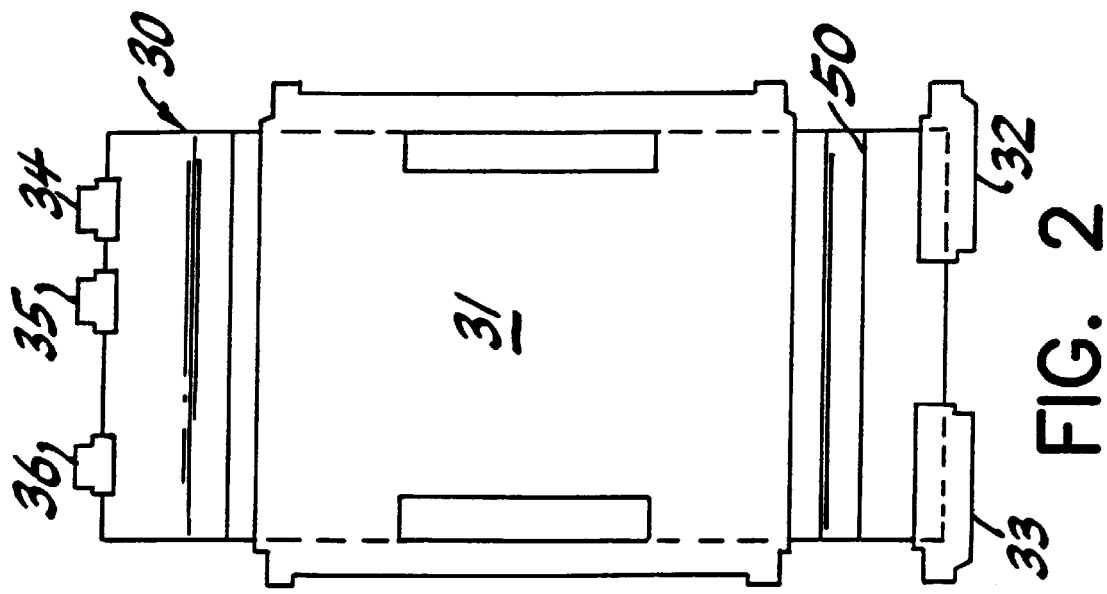
FIG. 2 is a bottom view of the package of the preferred embodiment of the invention.

Referring first to FIGS. 1 to 4, the exterior of the surface-mount package of the preferred embodiment of the invention is shown, and consists of a molded insulation plastic housing 30 which is an elongated rectangle and incorporates the upper surfaces and portions of the edges of a flat single gauge lead frame which may be a conventional copper alloy about 1.27 mm thick. In a preferred embodiment, housing 30 is about 29 mm long, 14.2 mm wide, and 4.27 mm high. The lead frame is described in more detail below with reference to FIGS. 6, 7 and 8. The lead frame elements shown in FIGS. 1 to 4 are lead frame heat sink pad 31, power terminals 32 and 33 on the corners of one edge of the rectangular housing 30 and control terminals or pins 34, 35 and 36 along the opposite side of housing. Terminals 32 to 36 extend about 1 mm beyond the ends of the housing. Terminals 34 and 35 are preferably closely spaced, for example, about 2.5 mm center to center while terminals 35 and 36 are preferably more widely spaced, for example, about 6.0 mm center to center.

Figure 3:
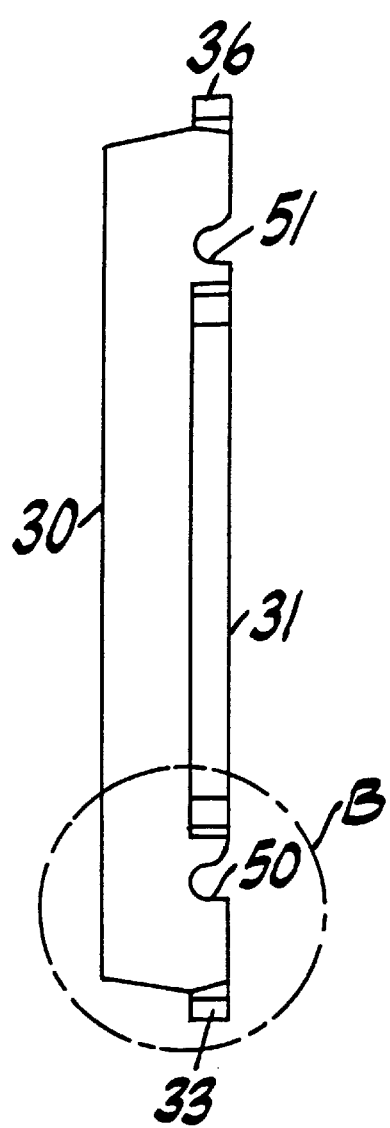
FIG. 3 is a side view of the package of the preferred embodiment of the invention.
Figure 5:
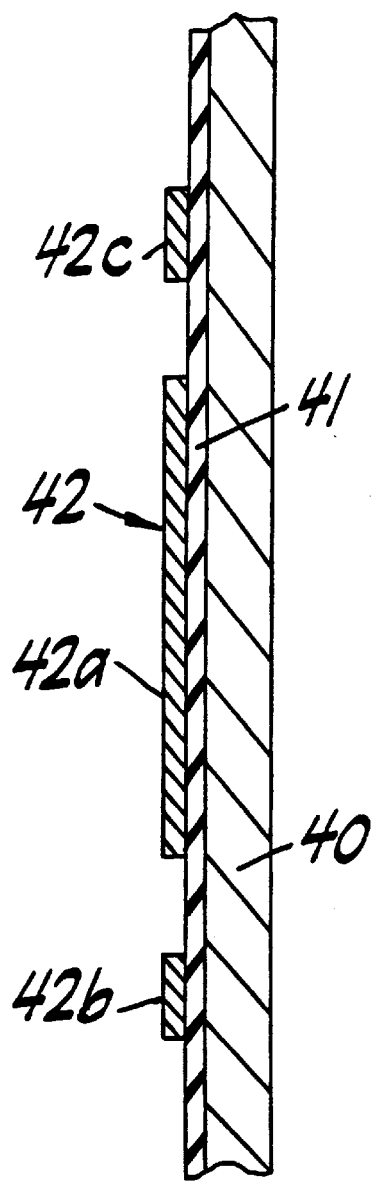
FIG. 5 is a cross-sectional view of an IMS support board to which the package of FIGS. 1 to 4 can be mounted.
Figure 4:
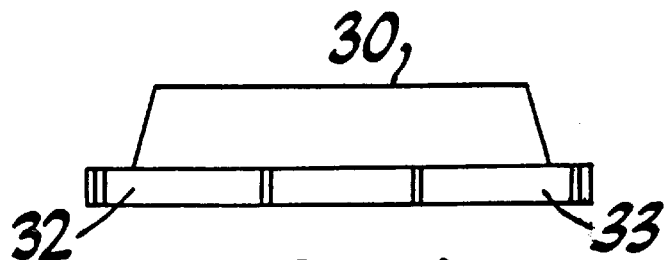
FIG. 4 is an end view of the main power terminal end of the package of the preferred embodiment of the invention.

As shown in FIG. 3, the bottom surfaces of pad 31 and terminals 32 to 36 are co-planar and are capable of connection to the patterned surface of a heat sink support such as an IMS board. FIG. 5 shows a cross-section of a typical IMS board which consists of a thick thermally conductive (copper or aluminum alloy) substrate 40 which is covered with a very thin insulation polymer 41. A patternable thin conductive solderable layer 42 is disposed atop insulator 41. Any desired pattern can be formed in layer 42 but, in FIG. 5, the layer 42 is separated into a portion 42a and a plurality of segments aligned with terminals 32 to 36. Only segments 42b and 42c, which align, for example, with terminals 32 and 34 respectively, are shown in FIG. 5. It then becomes convenient to solder down the bottom of the package of FIGS. 1 to 4 to the IMS board of FIG. 5, using standard soldering techniques.

Figure 1:
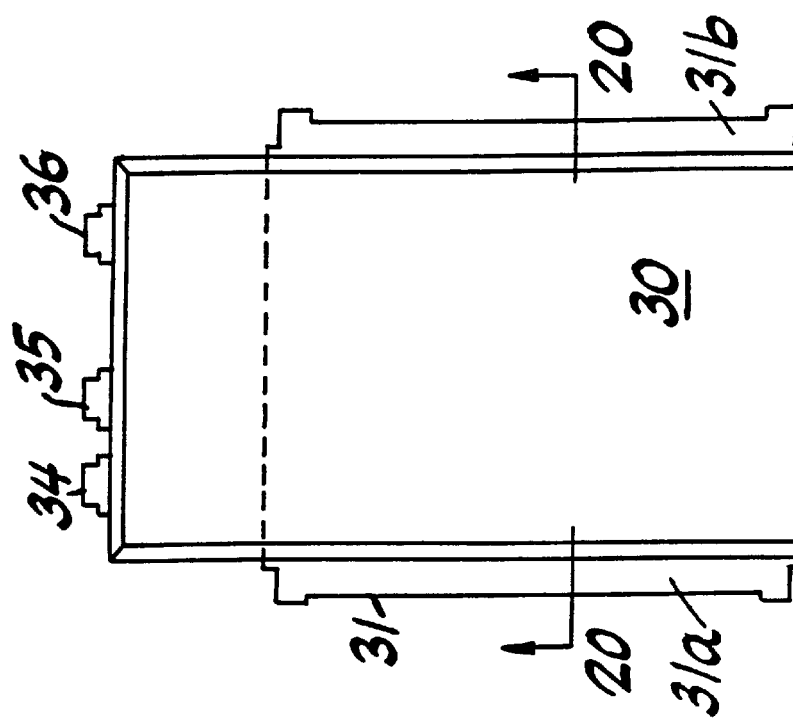
FIG. 1 is a top view of the package of the preferred embodiment of the invention.
Figure 20:
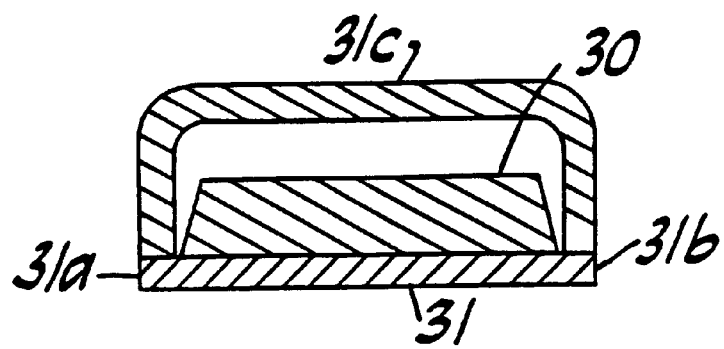
FIG. 20 shows a cross-sectional view of the package as shown in FIG. 1 through 20—20 and also including a U-shaped heat sink.

As shown in FIGS. 1 and 20, the pad 31 extends beyond the housing 30 when viewed from above and from the side. Specifically, pad portions 31a and 31b extend laterally beyond the side surfaces of the housing 30. Such lateral extending pad portions 31a, 31b provide an enlarged heat sink contact area and enables the coupling of the pad 31 to a, for example, U-shaped heat sink 31c for superior heat dissipation of the overall package. Preferably, the U-shaped heat sink 31c is soldered to the pad portions 31a, 31b.

To assist and improve the solder-down operation, flux washing grooves 50 and 51 (FIGS. 2 and 3) are formed across the bottom of plastic housing 30 between and parallel to the opposite edges of pad 31 and the lines of terminals 32–33 and 34–36 respectively. Grooves 50 and 51 preferably have a curved cross-section and a radius of about 0.4 mm. These grooves are very useful to assist in washing away solder flux after the solder down operation, and further increase the tracking distance over the plastic surface between pad 31 and terminals 32 to 36.

Figure 10:
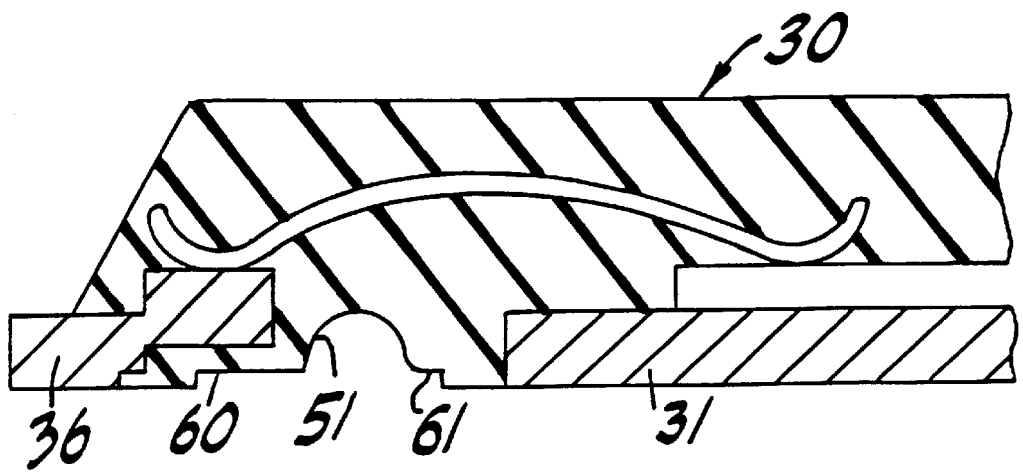
FIG. 10 is an enlarged detail of circled region "B" in FIG. 3 showing the locking of a control terminal into the plastic housing and the novel washing groove structure.

In order to improve the flux washing function, it was found useful to provide shallow short shelves, shown as shelves 60 and 61 in FIG. 10. Shelves 60 and 61 have a depth of about 0.1 mm, and ensure that their respective washing grooves 50 and 51 are spaced and open above the substrate to which the package is soldered.

Figure 6:
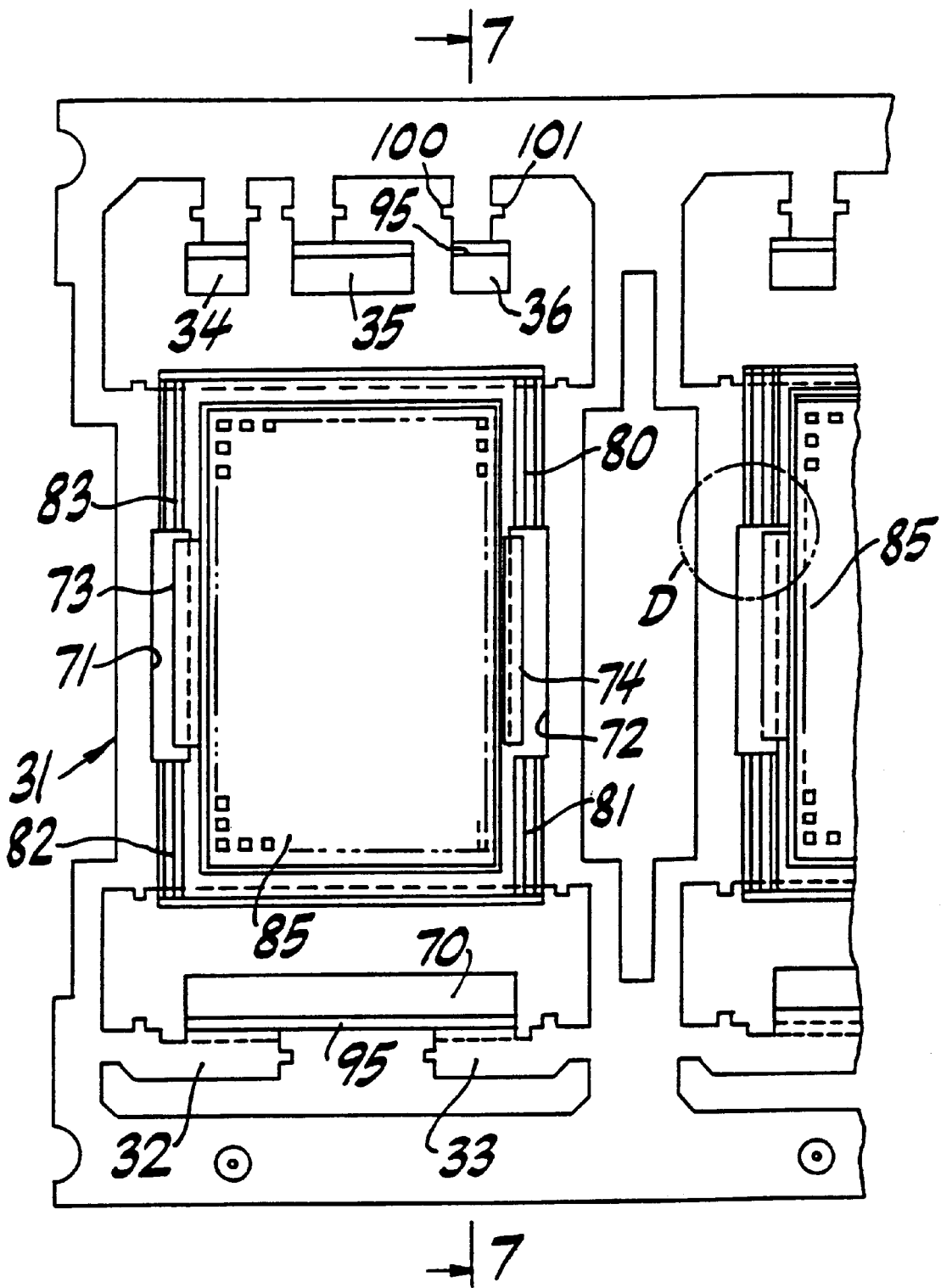
FIG. 6 is a top view of the lead frame used in the package of FIGS. 1 to 4.
Figure 7:
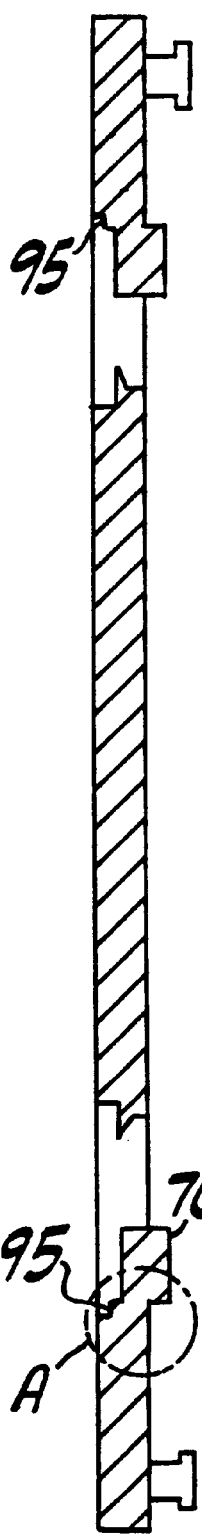
FIG. 7 is a cross-sectional view of FIG. 6 taken across section line 7—7 in FIG. 6.
Figure 8:
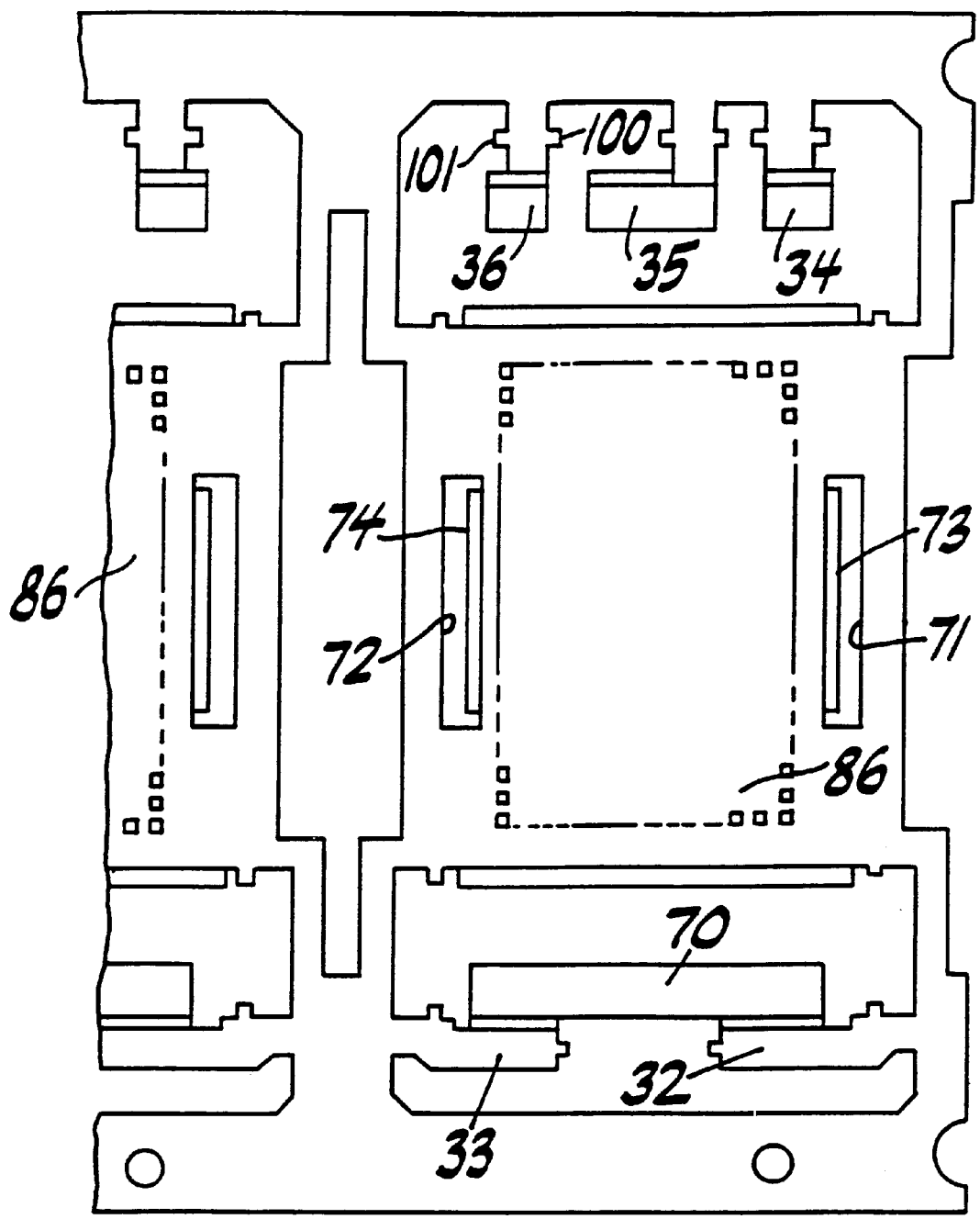
FIG. 8 is a bottom view of the lead frame of FIG. 6.

The lead frame itself, before receiving die or a housing, is shown in FIGS. 6, 7 and 8. The pad 31 and terminals 32 to 36 are integral parts of the lead frame and are joined by segments which are cut away after over-molding to isolate contacts 34 to 36 from contacts 32, 33 and from the pad 31 and from one another. The lead frame also contains a heavy cross bar 70 (FIGS. 6 to 8 and 18) which connects power terminals 32 and 33 together, and further acts as a plastic lock to help anchor the lead frame into plastic housing 30. Bar 70 also serves as a bonding surface for wire bonds, as will be described in connection with FIGS. 18 and 19.

Pad region 31 has two parallel thin slots 71 and 72 (FIGS. 6 to 8, 14 and 15) which fill with plastic during the molding operation, also creating a plastic lock, to help lock pad 31 to housing 30. Intentional short barbs 73 and 74 extend from the interior walls of slots 71 and 72, respectively, creating yet another plastic lock, to further anchor the lead frame pad 31 to the plastic housing.

In order to still further assist as a plastic lock, dovetail grooves 80 to 83 (FIGS. 6, 14 and 15) extend from the ends of slots 71 and 72 on the top surface of pad 31 toward the ends thereof. These fill with plastic during the molding operation to further lock pad 31 to the housing.

It will be noted that the top central surface of pad 31 has a "waffled" surface 85. The top surface of pad 31 may be nickel plated and has a pattern of shallow (preferably about 0.05 mm) spaced indentations, preferably dot-shaped indentations of about 0.25 mm diameter on about 0.6 mm centers. It is known that this waffle pattern improves the solder down of die to the waffled surface. In accordance with another aspect of the preferred embodiment of the invention, the opposite side of the pad 31 is also provided with a waffle pattern 86 (FIG. 8). This surface is ordinarily flat and smooth, but it has been found that if the surface is slightly concave, undesirable solder voids can be formed during the solder-down process. In accordance with the invention, a waffle pattern on the bottom of the concave lead frame surface improves its ability to be soldered to a flat heat sink surface by increasing the wetting and flow of solder therebetween.

Figure 9:
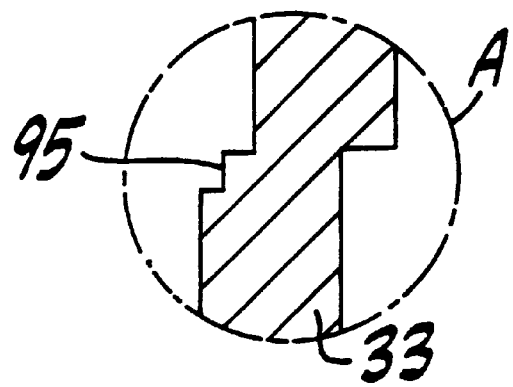
FIG. 9 is an enlargement of circled area "A" in FIG. 7.
Figure 11:
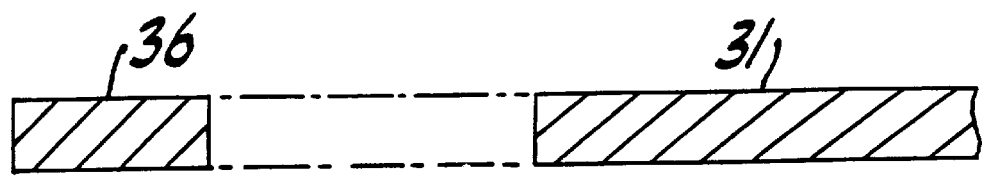
FIG. 11 shows a portion of the flat single gauge lead frame of the preferred embodiment of the invention without terminal lead offset.
Figure 12:
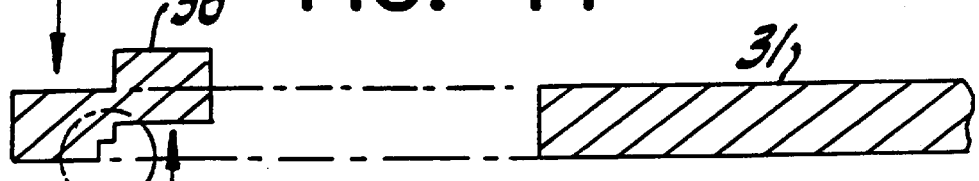
FIG. 12 shows the lead frame of FIG. 11 after offsetting of the terminal leads.
Figure 13:
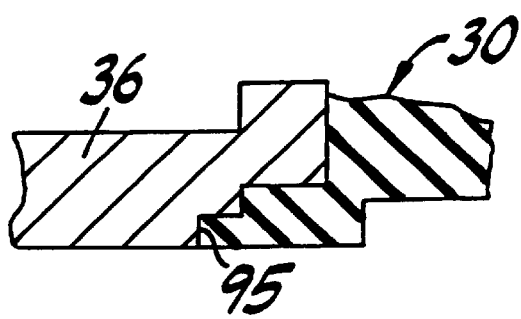
FIG. 13 shows the formation of a stepped corner at corner region "C" in FIG. 12 to prevent plastic bleeding over the bottom surface of the terminal during molding.
Figure 14:
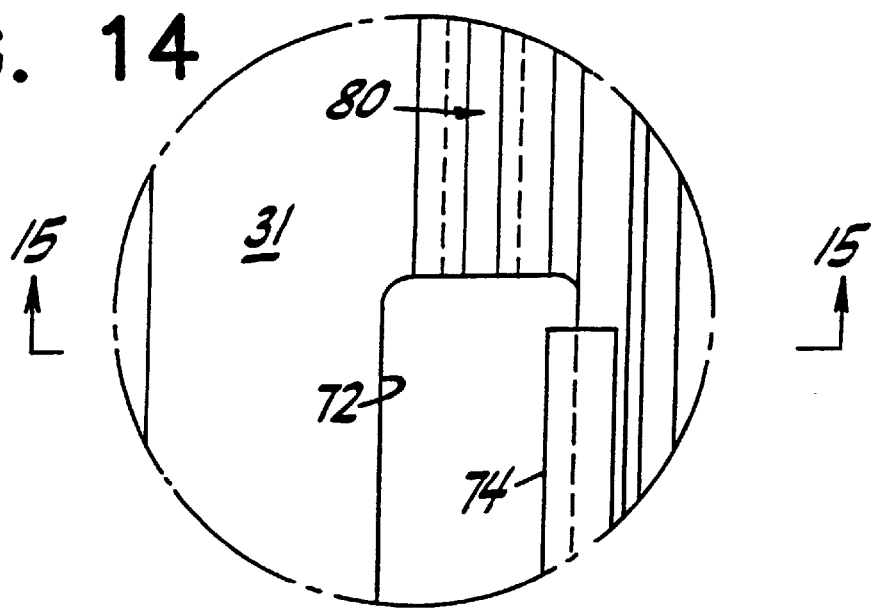
FIG. 14 is an enlargement of circled region "D" in FIG. 6 and shows a plastic lock groove extending from the end of the plastic lock slot in the lead frame.
Figure 15:
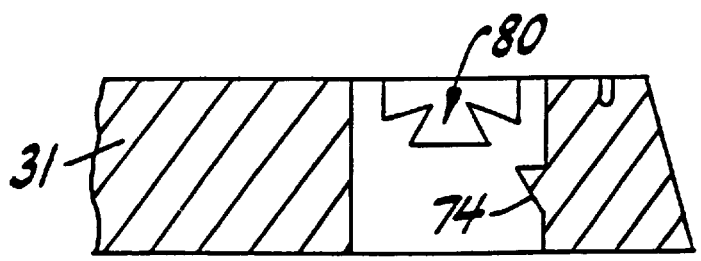
FIG. 15 is a cross-section of FIG. 14 taken across section line 15—15 in FIG. 14.

FIG. 11 shows a cross-section of a portion of the lead frame containing pad 31 and contact 36. This frame is originally a perfectly flat frame with flat planar top and bottom surfaces. It was found that, by slightly displacing the terminal sections of the lead frame by a partial stamping operation as shown in FIG. 12, the terminals are better locked into the plastic housing 30. The actual displacement used is about 0.5 mm for a 1.27 mm thick lead frame. It was found that during the molding operation (after this off-setting process), plastic tended to bleed past the slightly rounded edge at location "C" in FIG. 12, over the bottom surface of terminal 36 and over the other off-set terminals 32 to 35. It was found that the stamping of a square notch 95 (FIG. 9 and 13) at the corner "C" in each terminal prevented this undesired bleeding of plastic. The notch 95 is preferably formed by shearing the material (as opposed to bending) because such a method requires no additional lateral space.

Notch 95 is about 0.2 mm deep and 0.3 mm long. Notch 95 is shown in FIGS. 6 and 7 for each of the offset terminals 32 to 36.

Figure 16:
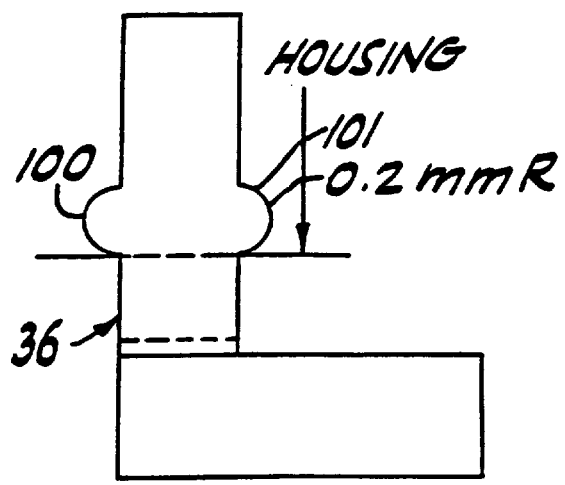
FIG. 16 is a top view of a severed lead frame terminal and shows sacrificial vertical crushable bumps or beads on the sides of the terminal which seal the mold tool to prevent bleeding of the plastic onto the exposed solderable surface of the terminal.
Figure 17:
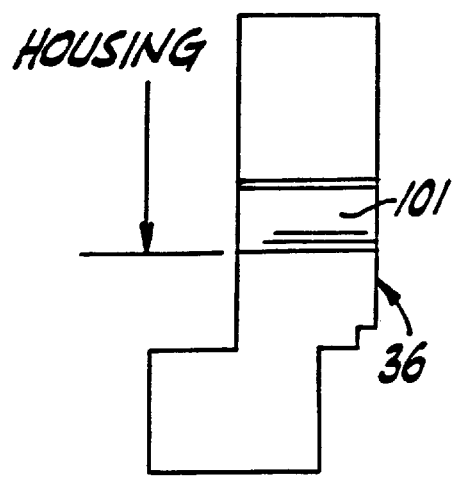
FIG. 17 is a side view of FIG. 16.

As a still further feature of the novel package, each of the pins or terminals extending through the plastic housing 30 has one or more small beads extending from the thickness of the terminal. The thickness of the beads 100, 101 should vary in accordance with the thickness of the lead frame. In general, the beads 100, 101 will be from 0.05 to 0.5 mm thick. Thus, as shown in FIGS. 16 and 17, two crushable beads 100 and 101, having radii, for example, of about 0.2 mm (for a lead frame of 1.2 mm), serve to be crushed or partly flattened by a molding tool to prevent the bleeding of plastic beyond the boundary defined by the beads 100 and 101. The crushable beads are shown in FIGS. 6 and 7 at all necessary locations on the lead frame.

Figure 18:
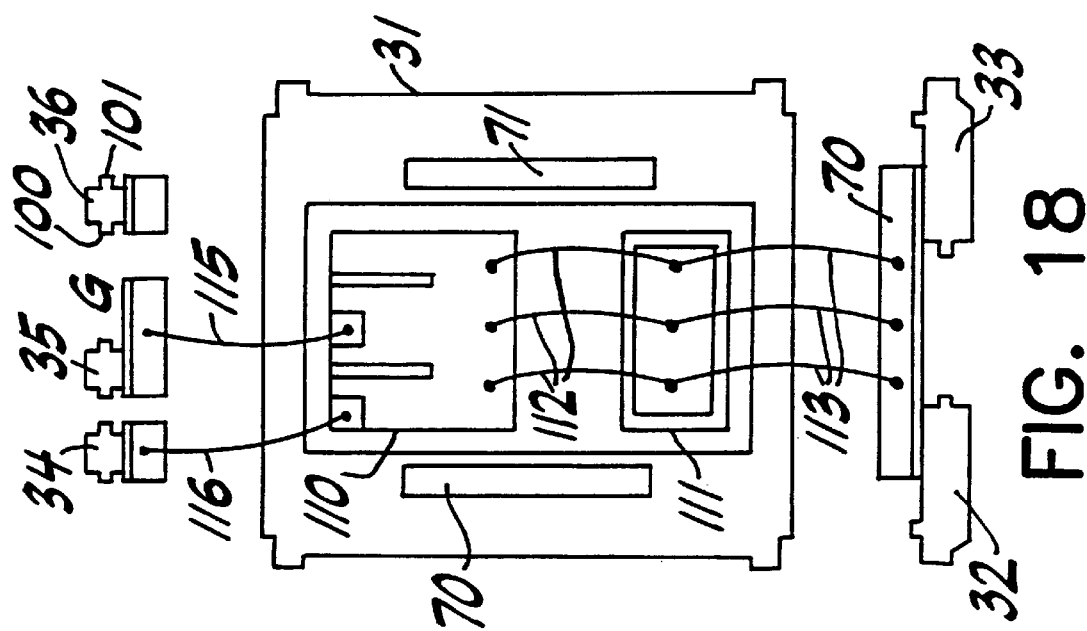
FIG. 18 shows the lead frame of FIG. 6 with semiconductor die soldered down to the pad and bonding wire connecting the die to external terminals, and shows the manner in which the lead frame is trimmed after the molded housing (not shown) is formed.

FIG. 18 shows the lead frame pad 31 after two semiconductor device die 110 and 111 have been soldered down to pad 31, called a copack. Die 110 and 111 of the copack may be of any type, but are shown in FIG. 18 and 19 as a power IGBT and a fast recovery diode (FRED), respectively.

Figure 19:
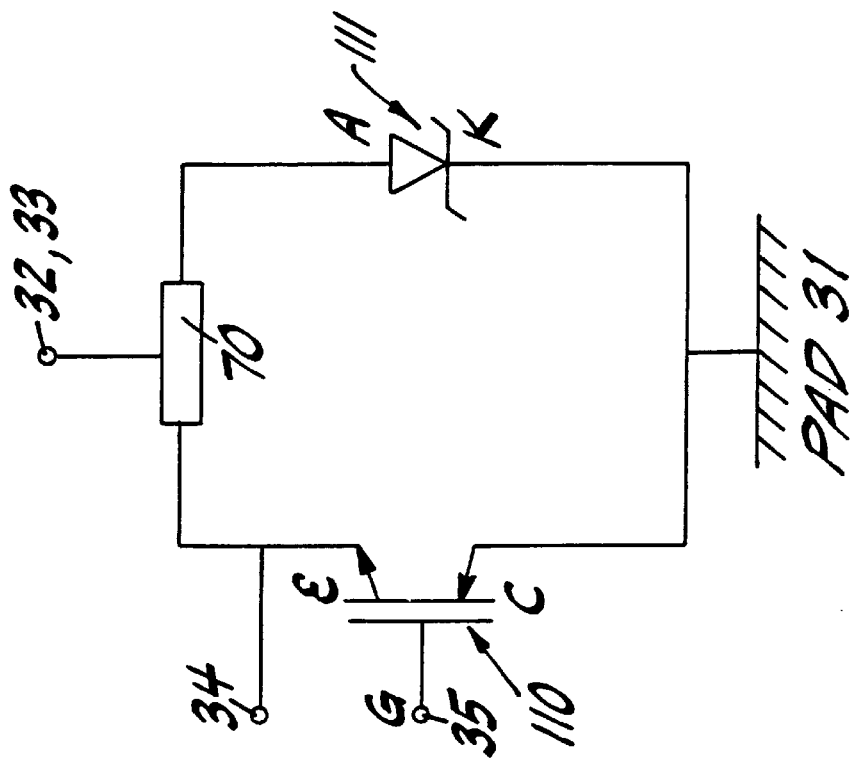
FIG. 19 shows a circuit diagram of FIG. 18.

It is noted that in FIG. 19 the collector electrode of IGBT 110 is connected to the cathode of FRED diode 111 because those electrodes are soldered to and connected by conductive pad 31. Thus, the conductive pad 31 provides a means for electrically interconnecting the copack to an external circuit. The top emitter electrode of IGBT 110 is wire bonded, as by wires 112 to the anode electrode of FRED diode 111. Wire bonds 113 continue and are connected to cross bar 70 and terminals 32, 33.

Further, a wire bond 115 is made from the gate pad of IGBT 110 to gate terminal 35 and an emitter Kelvin connection 116 may also be provided at terminal 34 as shown in FIG. 18.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A surface mount semiconductor package, comprising:
   a semiconductor device;
   a metal pad on which the semiconductor device is mounted; and
   a housing formed of a flowable material which bonds to the metal pad and encapsulates the semiconductor device when cured, the housing including at least one washing groove formed across the bottom and extending between opposing sides thereof, the washing groove having shelf portions disposed along at least one edge thereof, the shelf portion having a shallower depth than the washing groove.

2. The surface mount semiconductor package of claim 1, wherein the package further comprises one or more terminals co-planar with and spaced away from the metal pad, the washing groove passing between the metal pad and the terminals.

3. The surface mount semiconductor package of claim 1, wherein the package further comprises one or more first terminals co-planar with and spaced away from one end of the metal pad and one or more second terminals co-planar with and spaced away from an opposite end of the metal pad, at least one groove passes between the one end of the metal pad and the first terminals and at least one groove passes between the opposite end of the metal pad and the second terminals.

4. The surface mount semiconductor package of claim 3, wherein the housing includes one washing groove disposed at the one end thereof and another washing groove disposed at the opposite end thereof, the washing grooves being substantially parallel across the bottom of the housing.

5. The surface mount semiconductor package of claim 1, wherein the groove has a curved cross section.

6. The surface mount semiconductor package of claim 5, wherein the grooves have a radius of approximately 0.44 mm and the shelf portions have a depth of about 0.1 mm.

7. The surface mount semiconductor package of claim 1, wherein the housing is made of a material selected from the group consisting of plastics and ceramics.

8. The surface mount semiconductor package of claim 1, further comprising:
   a cross bar; and
   at least first and second terminals, the first and second terminals being co-planar with and spaced away from the metal pad, the first and second terminals being spaced apart from one another and coupled together by the cross bar, the cross bar locking the metal pad, the first and second terminals and the housing together when the flowable material of the housing cures.

9. The surface mount semiconductor package of claim 1, wherein the metal pad includes at least one slot disposed along an edge thereof, the slot accepting the flowable material of the housing and locking the metal pad to the housing when the housing cures.

10. The surface mount semiconductor package of claim 9, wherein the slot includes a barb extending from an interior wall of the slot, the barb engaging the housing material and locking the metal pad to the housing.

11. The surface mount semiconductor package of claim 10, wherein the at least one slot includes two parallel slots, the slots being disposed along opposing edges of the metal pad.

12. The surface mount semiconductor package of claim 1, wherein the metal pad includes a dove-tail groove disposed along at least a portion of at least one edge of the metal pad, the groove accepting the flowable material of the housing and locking the metal pad to the housing when the housing cures.

13. The surface mount semiconductor package of claim 12, wherein the metal pad includes dove-tail grooves disposed along the edges thereof from respective ends of the slots toward adjacent edges of the metal pad, the dove-tail grooves accepting the flowable material of the housing and locking the metal pad to the housing when the housing cures.

14. The surface mount semiconductor package of claim 1, further comprising at least one terminal being spaced away from the metal pad and having one portion which is co-planar with the metal pad and an offset portion, the terminal including a notch disposed along a bottom edge of the co-planar portion for preventing the flowable material of the housing from bleeding onto a bottom surface of the co-planar portion while the housing cures.

15. The surface mount semiconductor package of claim 1, further comprising:
   at least one terminal being spaced away from and co-planar with the metal pad; and
   at least one crushable bead disposed on a side surface of the terminal for preventing the flowable material of the housing from bleeding past a molding tool used to form the housing.

16. The surface mount semiconductor device package of claim 15, wherein the package includes a plurality of terminals, each terminal having a crushable bead on each side surface thereof.

17. The surface mount semiconductor device package of claim 16, wherein at least one crushable bead on one of the terminals is axially aligned with at least one crushable bead on the other terminals which are located on one side of the package.

18. The surface mount semiconductor device package of claim 17, wherein the crushable bead is from about 0.05 to 0.5 mm thick.

19. The surface mount semiconductor device package of claim 15, wherein the crushable bead has a radius of about 0.2 mm.

20. The surface mount semiconductor package of claim 1, wherein the metal pad includes:
   laterally extending portions which extend beyond lateral edges of the housing for providing increased heat dissipation of the package and for providing a top surface on which a heat sink is mounted to the package; and
   a bottom surface operable to be mounted on a substrate.

21. The surface mount semiconductor device package of claim 20, wherein the metal pad includes first and second laterally extending portions, the first lateral extending portion extending beyond one lateral edge of the housing, the second lateral extending portion extending beyond an opposite lateral edge of the housing and the heat sink is coupled to the first and second lateral extending portions.

22. The surface mount semiconductor device package of claim 21, wherein the heat sink is U-shaped.

23. The surface mount semiconductor package of claim 1, wherein the package further comprises at least three terminals co-planar with and spaced away from one end of the metal pad, two of the terminals being spaced close together relative to a third terminal.

24. A surface mount semiconductor package, comprising:
   a semiconductor device;
   a metal pad on which the semiconductor device is mounted, the metal pad including at least one slot disposed along an edge thereof;
   a housing formed of a flowable material which bonds to the metal pad and encapsulates the semiconductor device when cured, the slot of the metal pad accepting the flowable material of the housing and locking the metal pad to the housing when the housing cures;
   a cross bar; and
   at least first and second terminals, the first and second terminals being co-planar with and spaced away from the metal pad, the first and second terminals being spaced apart from one another and coupled together by the cross bar, the cross bar locking the metal pad, the first and second terminals and the housing together when the flowable material of the housing cures.

25. The surface mount semiconductor package of claim 24, wherein the slot includes a barb extending from an interior wall of the slot, the barb engaging the housing material and locking the metal pad to the housing.

26. The surface mount semiconductor package of claim 25, wherein the at least one slot includes two parallel slots, the slots being disposed along opposing edges of the metal pad.

27. The surface mount semiconductor package of claim 24, wherein the metal pad includes a dove-tail groove disposed along at least a portion of at least one edge of the metal pad, the groove accepting the flowable material of the housing and locking the metal pad to the housing when the housing cures.

28. The surface mount semiconductor package of claim 27, wherein the metal pad includes dove-tail grooves disposed along the edges thereof from respective ends of the slots toward adjacent edges of the metal pad, the dove-tail grooves accepting the flowable material of the housing and locking the metal pad to the housing when the housing cures.

29. The surface mount semiconductor package of claim 24, wherein the housing is formed of plastic.

30. The surface mount semiconductor package of claim 24, further including at least one terminal being spaced away from the metal pad and having one portion which is co-planar with the metal pad and an offset portion, the terminal including a notch disposed along a bottom edge of the co-planar portion for preventing the flowable material of the housing from bleeding onto a bottom surface of the co-planar portion while the housing cures.

31. The surface mount semiconductor package of claim 24, further comprising:
   at least one terminal being spaced away from and co-planar with the metal pad; and
   at least one crushable bead disposed on a side surface of the terminal for preventing the flowable material of the housing from bleeding past a molding tool used to form the housing.

32. The surface mount semiconductor device package of claim 31, wherein the package includes a plurality of terminals, each terminal having a crushable bead on each side surface thereof.

33. The surface mount semiconductor device package of claim 32, wherein at least one crushable bead on one of the terminals is axially aligned with at least one crushable bead on the other terminals which are located on one side of the package.

34. The surface mount semiconductor device package of claim 33, wherein the crushable bead is from about 0.05 to 0.5 mm thick.

35. The surface mount semiconductor device package of claim 31, wherein the crushable bead has a radius of about 0.02 mm.

36. The surface mount semiconductor package of claim 24, wherein the metal pad includes:
   laterally extending portions which extend beyond lateral edges of the housing for providing increased heat dissipation of the package and for providing a top surface on which a heat sink may be mounted to the package; and a bottom surface operable to be mounted on a substrate.

37. The surface mount semiconductor device package of claim 36, wherein the metal pad includes first and second laterally extending portions, the first lateral extending portion extending beyond one lateral edge of the housing, the second lateral extending portion extending beyond an opposite lateral edge of the housing and the heat sink is coupled to the first and second lateral extending portions.

38. The surface mount semiconductor device package of claim 37, wherein the heat sink is U-shaped.

39. The surface mount semiconductor package of claim 24, wherein the package further comprises at least three terminals co-planar with and spaced away from one end of the metal pad, two of the terminals being spaced close together relative to a third terminal.

40. A surface mount semiconductor device package, comprising:

a semiconductor device;

a metal pad on which the semiconductor device is mounted;

a housing formed of a flowable material which bonds to the metal pad and encapsulates the semiconductor device when it cures; and at least one terminal being spaced away from the metal pad and having one portion which is co-planar with the metal pad and an offset portion, the terminal including a notch disposed along a bottom edge of the co-planar portion for preventing the flowable material of the housing from bleeding onto a bottom surface of the co-planar portion while the housing cures.

41. The surface mount semiconductor device package of claim 40, further comprising:

at least one terminal being spaced away from and co-planar with the metal pad; and at least one crushable bead disposed on a side surface of the terminal for preventing the flowable material of the housing from bleeding past a molding tool used to form the housing.

42. The surface mount semiconductor device package of claim 41, wherein the package includes a plurality of terminals, each terminal having a crushable bead on each side surface thereof.

43. The surface mount semiconductor device package of claim 42, wherein at least one crushable bead on one of the terminals is axially aligned with at least one crushable bead on the other terminals which are located on one side of the package.

44. The surface mount semiconductor device package of claim 43, wherein the crushable bead is from about 0.05 to 0.5 mm thick.

45. The surface mount semiconductor device package of claim 43, wherein the crushable bead has a radius of about 0.2 mm.

46. The surface mount semiconductor device package of claim 40, wherein the metal pad includes:

laterally extending portions which extend beyond lateral edges of the housing for providing increased heat dissipation of the package and for providing a top surface on which a heat sink may be mounted to the package; and a bottom surface operable to be mounted on a substrate.

47. The surface mount semiconductor device package of claim 46, wherein the metal pad includes first and second laterally extending portions, the first lateral extending portion extending beyond one lateral edge of the housing, the second lateral extending portion extending beyond an opposite lateral edge of the housing and the heat sink is coupled to the first and second lateral extending portions.

48. The surface mount semiconductor device package of claim 47, wherein the heat sink is U-shaped.

49. The surface mount semiconductor package of claim 40, wherein the package further comprises at least three terminals co-planar with and spaced away from one end of the metal pad, two of the terminals being spaced close together relative to a third terminal.

50. A surface mount semiconductor device package, comprising:

a semiconductor device;

a metal pad on which the semiconductor device is mounted;

a housing formed of a flowable material which bonds to the metal pad and encapsulates the semiconductor device when it cures;

at least one terminal being spaced away from and co-planar with the metal pad; and at least one crushable bead disposed on a side surface of the terminal for preventing the flowable material of the housing from bleeding past a molding tool used to form the housing.

51. The surface mount semiconductor device package of claim 50, wherein the package includes a plurality of terminals, each terminal having a crushable bead on each side surface thereof.

52. The surface mount semiconductor device package of claim 51, wherein at least one crushable bead on one of the terminals is axially aligned with at least one crushable bead on the other terminals which are located on one side of the package.

53. The surface mount semiconductor device package of claim 52, wherein the crushable bead is from about 0.05 to 0.5 mm thick.

54. The surface mount semiconductor device package of claim 50, wherein the crushable bead has a radius of about 0.2 mm.

55. The surface mount semiconductor package of claim 50, wherein the metal pad includes:

laterally extending portions which extend beyond lateral edges of the housing for providing increased heat dissipation of the package and for providing a top surface on which a heat sink may be mounted to the package; and a bottom surface operable to be mounted on a substrate.

56. The surface mount semiconductor device package of claim 50, wherein the metal pad includes first and second laterally extending portions, the first lateral extending portion extending beyond one lateral edge of the housing, the second lateral extending portion extending beyond an opposite lateral edge of the housing and the heat sink is coupled to the first and second lateral extending portions.

57. The surface mount semiconductor device package of claim 56, wherein the heat sink is U-shaped.

58. The surface mount semiconductor package of claim 50, wherein the package further comprises at least three terminals co-planar with and spaced away from one end of the metal pad, two of the terminals being spaced close together relative to a third terminal.

59. A surface mount semiconductor device package, comprising:

a semiconductor device;

a metal pad on which the semiconductor device is mounted;

a housing which bonds to the metal pad and encapsulates the semiconductor device, the metal pad including laterally extending portions which extend beyond lateral edges of the housing for providing increased heat dissipation of the package and for providing a top surface on which a heat sink may be mounted to the package, the metal pad further including a bottom surface operable to be mounted on a substrate.

60. The surface mount semiconductor device package of claim 59, wherein the metal pad includes first and second laterally extending portions, the first lateral extending portion extending beyond one lateral edge of the housing, the second lateral extending portion extending beyond an opposite lateral edge of the housing and the heat sink is coupled to the first and second lateral extending portions.

61. The surface mount semiconductor device package of claim 60, wherein the heat sink is U-shaped.

62. The surface mount semiconductor package of claim 59, wherein the package further comprises at least three terminals co-planar with and spaced away from one end of the metal pad, two of the terminals being spaced close together relative to a third terminal.

* * * * *